US010969429B1

(12) United States Patent
Kumar et al.

(10) Patent No.: US 10,969,429 B1
(45) Date of Patent: Apr. 6, 2021

(54) SYSTEM AND METHOD FOR DEBUGGING IN CONCURRENT FAULT SIMULATION

(71) Applicant: Cadence Design Systems, Inc., San Jose, CA (US)

(72) Inventors: Manoj Kumar, Westford, MA (US); Rishabh Gupta, Delhi (IN); Inderpreet Singh Baweja, Milton (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/538,920

(22) Filed: Aug. 13, 2019

(51) Int. Cl.
*G01R 31/317* (2006.01)
*G06F 16/245* (2019.01)

(52) U.S. Cl.
CPC . *G01R 31/31704* (2013.01); *G01R 31/31703* (2013.01); *G01R 31/31705* (2013.01); *G06F 16/245* (2019.01)

(58) Field of Classification Search
CPC .................................................. G01R 31/31704
See application file for complete search history.

(56) References Cited

U.S. PATENT DOCUMENTS

| | | | | |
|---|---|---|---|---|
| 5,184,308 A * | 2/1993 | Nagai | ................... | G06F 11/261 703/15 |
| 6,223,314 B1 * | 4/2001 | Arabi | ................. | G01R 31/3016 714/726 |
| 6,385,750 B1 * | 5/2002 | Kapur | ............... | G01R 31/31813 714/724 |
| 6,560,738 B1 * | 5/2003 | Shigeta | ............ | G01R 31/31832 714/724 |
| 6,975,978 B1 * | 12/2005 | Ishida | ............... | G01R 31/31834 324/762.03 |
| 9,262,299 B1 | 2/2016 | Wilmot et al. | | |
| 9,262,305 B1 | 2/2016 | Wilmot et al. | | |
| 10,339,229 B1 | 7/2019 | Wilmot et al. | | |
| 2008/0256404 A1 * | 10/2008 | Funatsu | ........... | G01R 31/31834 714/724 |
| 2009/0113261 A1 * | 4/2009 | Kajihara | .......... | G01R 31/31833 714/724 |
| 2010/0318864 A1 * | 12/2010 | Funatsu | ........... | G01R 31/31854 714/726 |

* cited by examiner

*Primary Examiner* — Joseph D Torres
(74) *Attorney, Agent, or Firm* — Mark H. Whittenbeerger, Esq.; Holland & Knight LLP

(57) ABSTRACT

The present disclosure relates to a system and method for debugging in fault simulation associated with an electronic design. Embodiments may include receiving, using at least one processor, an electronic design and performing concurrent fault simulation on a fault to be analyzed associated with the electronic circuit design, wherein the fault has a fault propagation path associated therewith. Embodiments may also include identifying a trace of one or more signals of interest that are in the fault propagation path and generating a faulty database and a good database associated with the one or more signals of interest that are in the fault propagation path. Embodiments may further include identifying one or more differences between the faulty database and the good database.

20 Claims, 13 Drawing Sheets

200

300

400

500

610

SYSTEM AND METHOD FOR DEBUGGING IN CONCURRENT FAULT SIMULATION

BACKGROUND

In electronic designs, safety engineers who hope to achieve safety verification, need to be able to take their functional verification environment and inject faults into the system-on-a-chip ("SoC"). The safety engineers need to validate if the injected faults into the SoC are propagated and detected at the functional and checker outputs to achieve the desired safety goal.

In some cases the injected fault is not detected at the functional or checker output due to a bug in the design. In this situation the safety engineer may need to trace the path of the injected fault node to the expected fault detection node. In order to achieve this safety engineers will generally attempt to mimic the debugging steps performed during functional verification. Existing debug environments provide no mechanism for tracing the fault path and the user has to debug the entire SoC which is a time consuming task.

SUMMARY

In one or more embodiments of the present disclosure, a computer-implemented method for debugging in fault simulation is provided. The method may include receiving, using at least one processor, an electronic design and performing concurrent fault simulation on a fault to be analyzed associated with the electronic circuit design, wherein the fault has a fault propagation path associated therewith. The method may also include identifying a trace of one or more signals of interest that are in the fault propagation path and generating a faulty database and a good database associated with the one or more signals of interest that are in the fault propagation path. The method may further include identifying one or more differences between the faulty database and the good database.

One or more of the following features may be included. In some embodiments, the one or more signals of interest may include one or more signals that have changed during the concurrent fault simulation. Identifying the trace of one or more signals of interest may include identifying only the trace of the one or more signals of interest that are in the fault propagation path. Generating the faulty database and the good database associated with the one or more signals of interest may include only generating data that is in the fault propagation path. The method may further include determining whether the fault propagated through one or more expected design blocks. The method may also include identifying all similarities between the good database and the faulty database. The method may further include ignoring the similarities between the good database and the faulty database.

In some embodiments, a computer-readable storage medium for electronic design simulation is provided. The computer-readable storage medium may have stored thereon instructions that when executed by a machine result in one or more operations. Operations may include receiving, using at least one processor, an electronic design and performing concurrent fault simulation on a fault to be analyzed associated with the electronic circuit design, wherein the fault has a fault propagation path associated therewith. Operations may also include identifying only a trace of one or more signals of interest that are in the fault propagation path and ignoring all traces that are not in the fault propagation path. Operations may further include generating a faulty database and a good database associated with the one or more signals of interest that are in the fault propagation path and identifying one or more differences between the faulty database and the good database.

One or more of the following features may be included. In some embodiments, the one or more signals of interest may include one or more signals that have changed during the concurrent fault simulation. Identifying the trace of one or more signals of interest may include identifying only the trace of the one or more signals of interest that are in the fault propagation path. Generating the faulty database and the good database associated with the one or more signals of interest may include only generating data that is in the fault propagation path. Operations may also include determining whether the fault propagated through one or more expected design blocks. Operation may further include identifying all similarities between the good database and the faulty database. Operations may also include ignoring the similarities between the good database and the faulty database.

In one or more embodiments of the present disclosure, a system having at least one processor is provided. The at least one processor may be configured to receive an electronic design and to perform concurrent fault simulation on a fault to be analyzed associated with the electronic circuit design, wherein the fault has a fault propagation path associated therewith. The least one processor may be further configured to identify a trace of one or more signals of interest that are in the fault propagation path and that have changed during the fault simulation. The least one processor may be further configured to ignore all signals that are not in the fault propagation path. The at least one processor may be further configured to generate a faulty database and a good database associated with the one or more signals of interest that are in the fault propagation path. The least one processor may be further configured to identify one or more differences between the faulty database and the good database.

One or more of the following features may be included. In some embodiments, identifying the trace of one or more signals of interest may include identifying only the trace of the one or more signals of interest that are in the fault propagation path. Generating the faulty database and the good database associated with the one or more signals of interest may include only generating data that is in the fault propagation path. The at least one processor may be further configured to determine whether the fault propagated through one or more expected design blocks. The at least one processor may be configured to identify all similarities between the good database and the faulty database. The at least one processor may be configured to ignore the similarities between the good database and the faulty database.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The foregoing and other aspects of various embodiments of the present disclosure will be apparent through examination of the following detailed description thereof in conjunction with the accompanying drawing figures in which similar reference numbers are used to indicate functionally similar elements.

DETAILED DESCRIPTION

Figure 1:
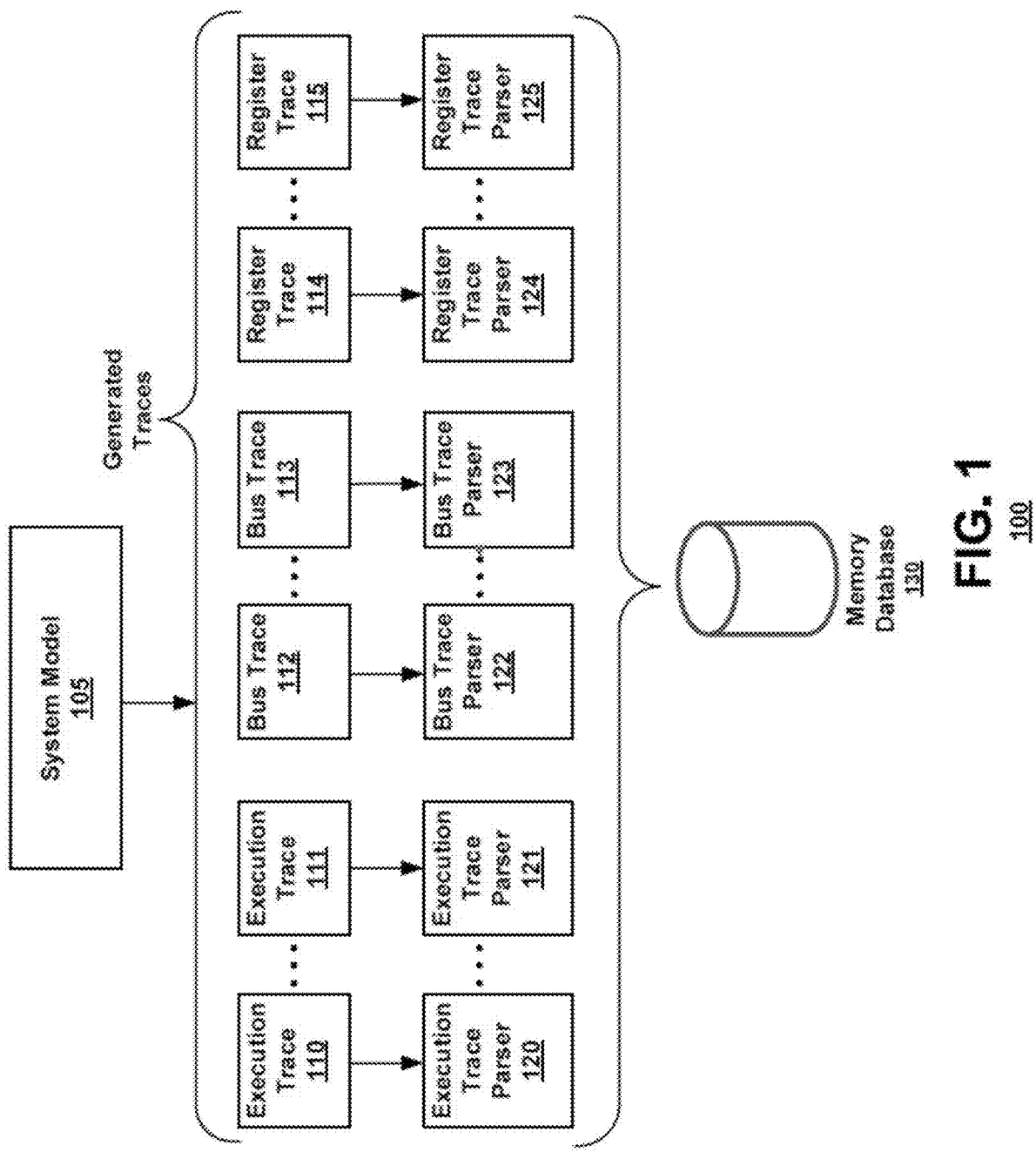
FIG. 1 is a simple block diagram illustrating components of an exemplary system according to an embodiment of the present disclosure.

FIG. 1 is a simplified block diagram illustrating components of an exemplary system 100 according to an embodiment. As shown in FIG. 1, a system model 105 will produce multiple traces 110-115 during simulation or emulation of the system model 105. The traces will then be captured for later use, for example, with a debugger.

According to an embodiment, the traces could be instantiated in the form of a single file, multiple files, or the trace data could arrive in groups of messages, in a database, etc. The individual traces could even be combined into a single information stream or file.

Then, from the captured traces, a trace event can be extracted. For example, events that occur either at a specific simulation time (e.g., at time 2 ns after simulation or execution start) or that occur in a specific execution sequence (e.g., the event was the 1014th that occurred after simulation or execution commenced) can be identified.

An exemplary execution trace message may include the following information: the device or element that executed the traced action (e.g., Processor X), the action that occurred (e.g., read/write), a length or number of words or lines affected (e.g., 1 word of memory), the value of the word or line (e.g., 0x01), the address that was accessed (e.g., 0x1111212), and the time the event occurred (e.g., 2 ns). The form and contents of the trace message may vary, but should provide sufficient information to extract event information in order to create a complete and accurate view of the system memory over time.

Bus transaction traces can have many formats. For example, the format of a bus trace can vary depending on the standard and system producing the trace, (e.g. the TLM 2.0 standard, ARM Tarmac Memory Bus Trace, etc.). However, a bus trace should include the following information: the initiator or master device that generated the bus transaction, the target or slave device that provides the information requested by the bus transaction, a mode such as read, write, read/write, etc., a time when the transaction occurred, the length of bytes that were requested, the address of the data that was written or read, and the data that was read or written. An exemplary bus trace message (simplified and expressed in human readable form) could be "Device dev1 reads 4 bytes of memory receiving value 0x20 from address 0x122211 of target device memory1 at time 23 ns". The form and contents of the trace message may vary, but should provide sufficient information to extract event information to contribute to a complete and accurate view of the system memory over time.

Similarly, a register trace message may include the device that interacted with the register (e.g., device dev1), the register that was affected (e.g., register RO), the value the register was changed to (e.g., 0x0), and the time the event occurred (e.g., 2 ns). The form and contents of the trace message may vary, but should provide sufficient information to extract event information to contribute to a complete and accurate view of the system memory over time.

For each source of execution, bus, or register transaction, there is a corresponding parser 120-125, that is able to parse out the trace messages to generate information about the specific values of data that resides in memory at a point in time. The parser may also understand register value changes and can build a memory map to map registers to addresses in memory. Hence when a register RO changes to value 0x0, the parser would know that this implies memory address 0x100000 took the value 0x0 if RO is mapped to address 0x100000.

When an execution trace parser parses out a message that either shows a memory value that it retrieved by reading from a memory or by writing a value to memory the parser commits the trace to the database 130. When a bus transaction trace parser parses out a bus transaction, it first determines whether the target device of the bus transaction is a memory being tracked in the database 130. If it is, the value that was either written or read is committed to the database 130. Bus transactions for target devices not being tracked may be ignored.

When a peripheral register trace parser parses out a register value change, it first uses a memory map to find out which address in physical memory should be updated when the register changes value. Then the value that was either written or read is committed to the database 130 using the address determined from the memory map.

A memory device such as a database 130 stores a representation of the system memory as a function of time. The database supports read and write operations. For example, an exemplary readMemory command may have the following inputs: a base address in memory, a length, and a time value. The readMemory command will then return the data from memory that was present at that time. The time value may represent simulation time, execution time, sequence, etc. The readMemory command will return either a value that was recorded from the received traces or zero if no trace operation involving the given memory address was discovered during trace parsing. An exemplary writeMemory command will include a base address, a length, a time value, and a data value that will be written to the database. According to an embodiment, the database 130 is a temporal database. Consequently, if no trace event occurred at the precise moment of time requested by the input time value, the database 130 will retrieve the value that was last set by reviewing earlier moments in time to identify the last event that affected that memory (if there was one). According to an embodiment, the database 130 could be implemented as a temporal sparse matrix or a three dimensional matrix.

According to an embodiment, an origination time is the first time when a complete physical memory dump is processed and stored in the memory database 130. This may be a logical time that relates to the time or sequence details of the simulation or execution session and may be some time after the simulation has begun (e.g., at a time greater than time 0). Any read operation that asks for a value at a time before the origination time will result in an error or a response that the value is not known.

According to an embodiment, the origination time may be set to time 0, e.g., when simulation or execution begins. Then all memory values will be presumed to be either 0 or undefined. For simplicity, and to avoid errors, all memory values may be considered to be in the "0" state at this origination time. According to an embodiment at origination time=time 0, the system may be preloaded with values in the database. For example, the initial values may be read from a file such as an Executable and Linkable Format (ELF) or Debugging With Attributed Record Formats (DWARF) compiler created file.

It is possible that multiple trace statements could contain trace messages that represent information about a memory at the same (or very time proximate) instance. For example, a value being read from a register and written to system memory will produce multiple traces. However, all such transactions can safely be written to memory because the trace information provides insight into the state of memory either via a read/write operation. In a properly functioning model or simulation, the values will be the same. According to an embodiment, conflicts of memory captured at substantially the same time may be identified, which could indicate that the model has a bug and give guidance for how to find the bug and correct the problem.

Once a complete and accurate view of system memory over the course of the simulation or emulation is captured, a debug or analysis environment can access the database 130 to read values, for example using a readMemory function, as needed to support desired operations that require knowledge of memory at given points in time.

Capturing trace information and using such information during interactive simulation and debugging is described in further detail in currently pending U.S. patent application Ser. No. 13/907,516, entitled "A Method for Interactive Embedded Software Debugging Through the Control of Simulation Tracing Components," the disclosures of which is incorporated herein by reference in its entirety.

Figure 2:
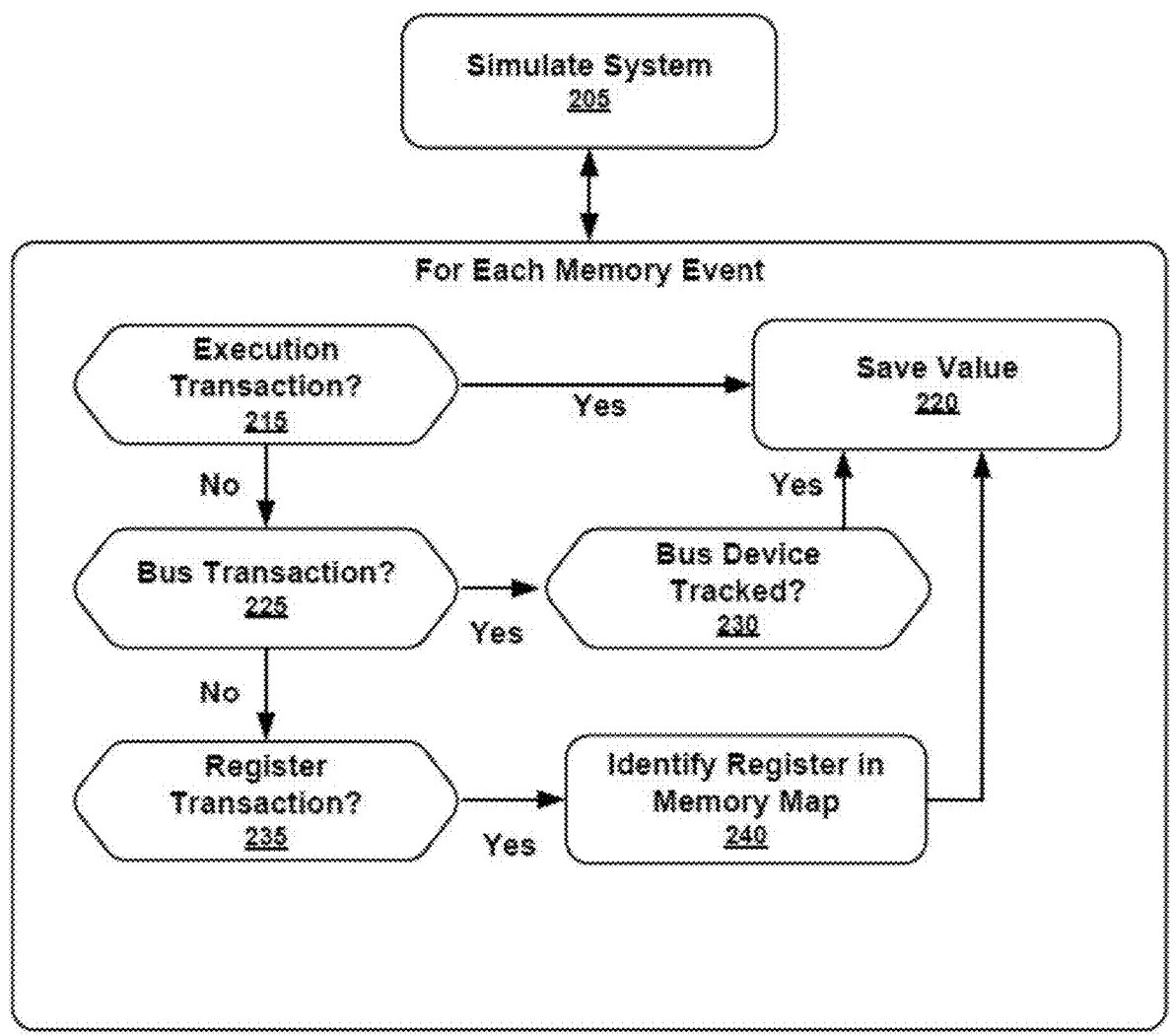
FIG. 2 illustrates an exemplary method for simulating hardware and software components implemented on a simulation platform according to an embodiment of the present disclosure.

FIG. 2 illustrates an exemplary method according to an embodiment. As shown in FIG. 2, initially a simulation or emulation of a system is initiated (block 205). Then, for each memory event or transaction detected, the trace of the transaction will be parsed. If the memory event is a read/write execution transaction for the system memory (block 215), then the value that was read or written to the memory is written to the memory database (block 220).

If the memory event is a bus transaction (block 225), if the transactions related to the target device of the bus transaction are being tracked (block 230), then the value transmitted on the bus is written to the memory database (block 220). However, if the target device is not being tracked (block 230), then nothing is written to the memory database.

If the memory event is a register transaction (block 235), then the register will be identified in a memory map to identify the address of values associated with the register in the memory database (block 240). If the register was not previously mapped, a new entry in the memory database will be created and the map updated to identify the new entry associated with the register (not shown). Once the register is identified in the memory map, the value stored to or read from the register is saved to the memory database (block 220).

After each memory event is processed, the simulation will continue until the next memory event is detected or the simulation completes. Once the simulation is complete, and there are no more memory events associated with the simulation, the simulation will exit, leaving an accurate copy of the memory at any given time of the simulation.

Figure 3:
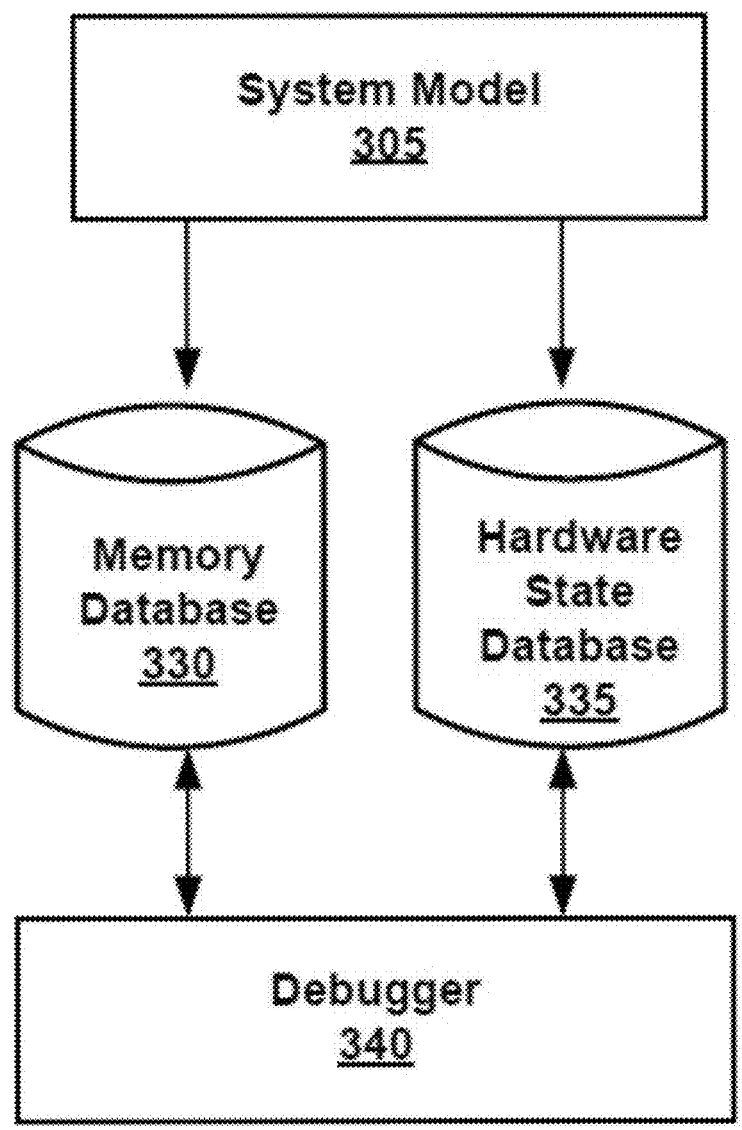
FIG. 3 is a simplified block diagram illustrating components of an exemplary system according to an embodiment.

FIG. 3 is a simplified block diagram illustrating components of an exemplary system according to an embodiment. In FIG. 3, similarly to FIG. 1 above, a system model 305 will produce multiple traces during simulation or emulation of the system model 305. The traces will then be captured and stored for later use in a memory database 330. Additionally, the state of all simulator processor registers will be stored in a hardware state database 335. The combination of the data stored in the memory database 330, the hardware state database 335, and symbolic software debugging information (e.g. Executable and Linkable Format (ELF) and Debugging With Attributed Record Formats (DWARF) compiler created files) will provide an accurate representation of the software state at any time during the simulation. This representation of the software state can later be accessed for example, with a post-processing debugger 340. The post-processing debugger can also access the state of hardware or memory at any point of the recorded simulation and compare the hardware and memory state to identify discrepancies. Therefore the debugger can be used to access information for the entire simulation platform including the software of the OS and the processes and threads of the platform, as well as the traces saved in the memory database.

According to an embodiment, a representation of embedded OS data structures and entry points will be used with the memory database 330 and hardware database 335 to implement post-processing debug and analysis capabilities for software processes and threads that were executed on the OS during simulation or emulation.

For example, a Program Counter (PC) register value that represents the location of a function in the embedded OS software that switches between processes can be searched forward or backward in the hardware state database. Similarly to the capture of the memory image in the memory database 330, this information may be captured and stored in the hardware database 335. The PC register will be monitored during simulation of the system model 305 and when a register event, transaction, or other change is detected, and trace will be transmitted to a register parser (not shown). The parser will parse the register trace and store the relevant information in the hardware state database 335. The capture of the PC register will capture the execution flow of bare-metal software and applications programs at an instruction level.

During post-process debug or other post-processing operations, when the desired PC value is found at a particular time point, then the values of memory from the memory database 330 and processor registers from the hardware state database 335 corresponding to that time point can be retrieved to reconstruct the values in OS process tables and other data structures at that particular time point. This information allows the addresses associated with arbitrary source functions or source lines in the OS process or thread that was scheduled to start at that time point to be calculated (again with the help of the symbolic software debugging information associated with the process or image running on the OS). This PC address can then be searched through in the hardware state database 335 to follow the particular line or function until a different PC value is encountered. An analogous algorithm can be devised for examining symbolic variable values in an arbitrary OS process or thread which has associated symbolic software debugging data. Similarly, values of important CPU registers can be recorded.

The insertion or creation of complex breakpoint conditions within a simulation platform is described in further detail in U.S. Pat. No. 9,262,299 entitled "Simulation Observability and Control of All Hardware and Software Components of a Virtual Platform Model of an Electronics System," U.S. Pat. No. 9,262,305 entitled "Simulation Observability and Control of All Hardware and Software Components of a Virtual Platform Model of an Electronics System," and currently pending U.S. patent application Ser. No. 13/907,516, the disclosures of which are incorporated herein by reference in their entirety.

Once the simulation has completed, and the memory and hardware databases have been populated, the captured information may be stepped through during post-processing operations. For example, a user may identify a new complex breakpoint condition according to a specified value of a variable. Then the post processing debugger will search or step through the known values of the variable as stored in the memory or hardware database in order to identify the breakpoint. This search can be performed forward or backward in time within the simulation time captured by the databases.

According to an embodiment, identifiers are constructed which unambiguously designate a particular state or element associated with a particular instance of a modeled hardware component or a particular instance, element or object of a modeled software component in the context of the entire captured simulation. Implementing global identifiers for each instance of a modeled element allows such identifiers to appear in condition expressions and action statements in the post-processing control interface and defines mechanisms for the control interface to query the memory database and the hardware state database as appropriate. Unique and unambiguous identifiers are further described in the aforementioned U.S. Patents and Patent Applications.

According to an embodiment of the present invention, to facilitate stepping through the source code of the modeled components with the post process debugger, breakpoints may be inserted as described above. During simulation, execution control may transition between the embedded software and the simulation control thread. When an operation crosses the software and hardware domains so that either the next software or hardware source code line, as appropriate, will be executed, the transition will be recorded, for example in the PC register. A user can then step through the actions performed and captured during simulation. For example, the debugger may cross the software and hardware domains so that either the next software or hardware source code line, as appropriate, will be shown to have been executed next to the user of the debugger. The user can then step through the executed lines in order from any identified point in the captured simulation. Additionally, the user will be able to step backward in time within the captured simulation.

Stepping between domains during simulation is further described in the aforementioned U.S. Patents and Patent Application.

Figure 4:
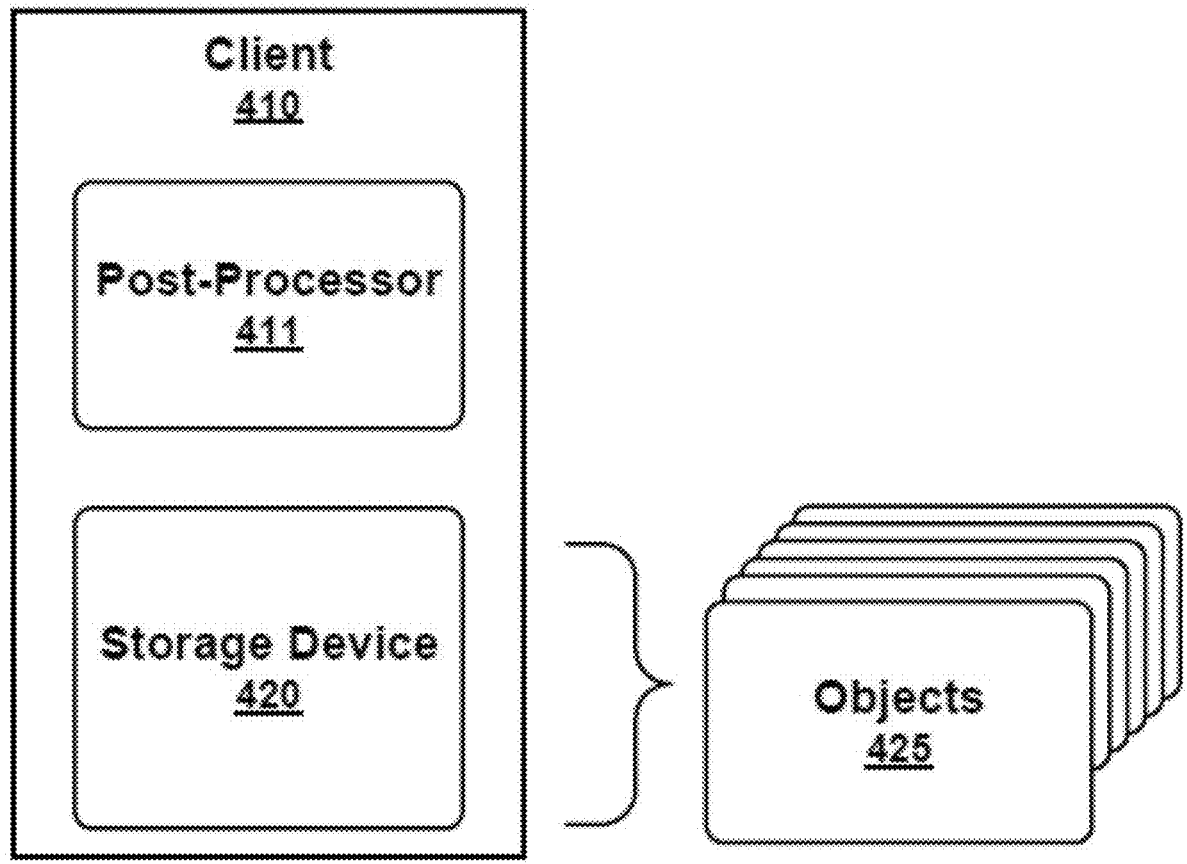
FIG. 4 is a simple block diagram illustrating components of an exemplary system according to an embodiment.

A user may access a post-processing interface in a stand-alone client system, client-server environment, or a networked environment. FIG. 4 is a simple block diagram illustrating components of an exemplary system 400 according to an embodiment. As shown in FIG. 4, a system 400 may comprise a client 410 executing a post-processor 411 and having a memory storage 420. The client 410 may be any computing system that executes a post-processor 411 or otherwise facilitates access to memory storage 420, for example a personal computer. The client 410 may include a processor that performs a method in accordance with the disclosed embodiments. Such a client would be part of an overall simulation system in accordance with the disclosed embodiments.

Hardware models, instruction sets, software packages, the hardware state database, the memory database, and other objects 425 used by the simulation system may be stored in memory storage 420. A user may access the objects 425 stored in memory storage 420 with the client 410 via a post-processing interface, where the post-processing interface is capable of accessing memory storage 420 and displaying the objects 425 and the data associated with the simulation. The post-processing interface may include a user interface, for example a program, application or middleware that acts as a frontend to and facilitates access to objects in memory storage 420. The post-processing interface may facilitate observability into the captured simulation of the modeled components using the display and edit tools and procedures described herein. The user may interact with the post-processing interface through a number of input devices, such as by inputting a selection as with a mouse or inputting a request as with a keyboard. The user may observe the simulation results on an output device or display. The post-processing interface may run in an application window controlled by the user.

As shown in FIG. 4, a client 410 may be a stand-alone system, as may be of particular interest where the components simulated are highly confidential. Additionally, according to an aspect of an embodiment as shown in FIG. 5, a client 510 may be part of a networked environment.

Figure 5:
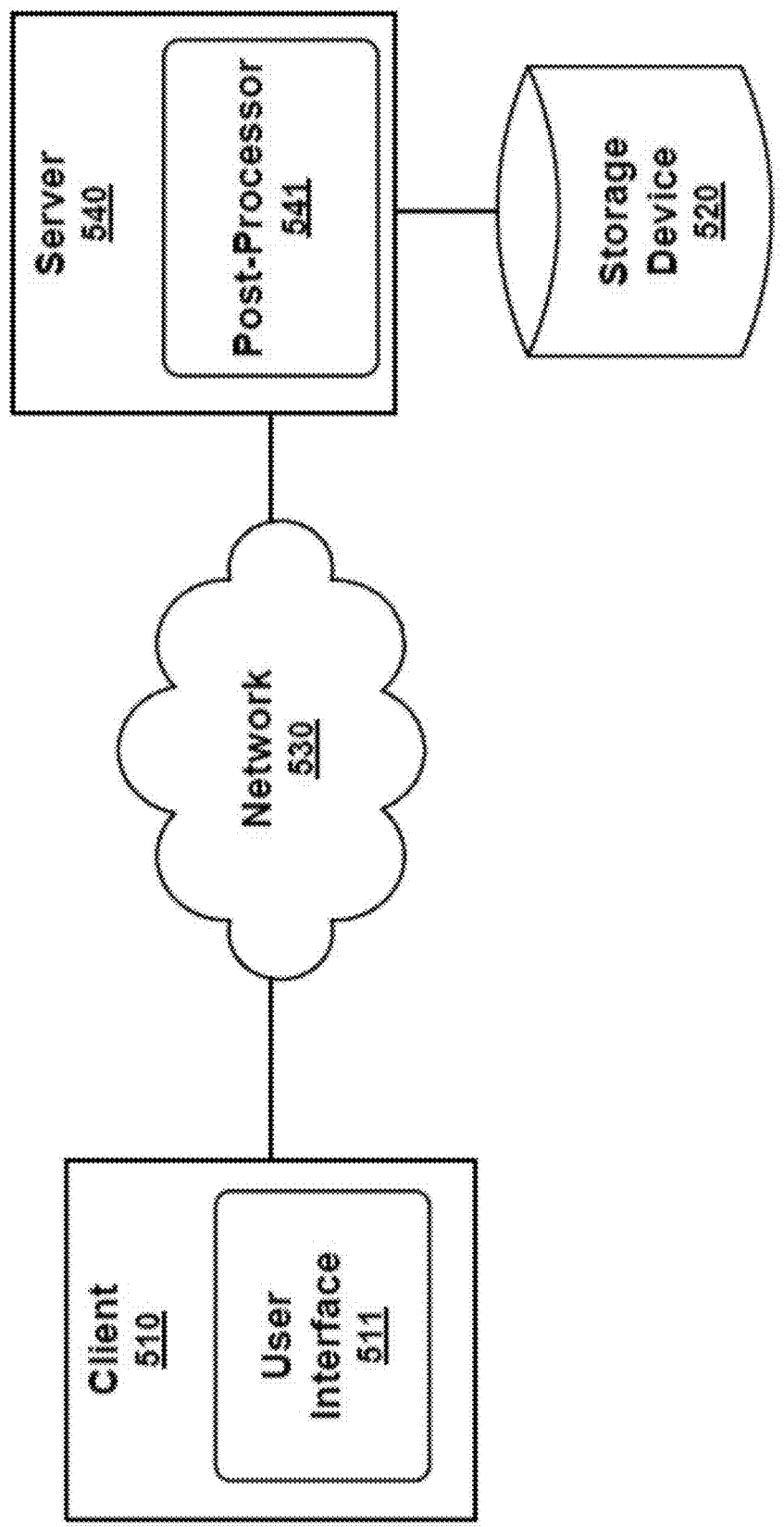
FIG. 5 is a simple block diagram illustrating components of an exemplary system according to an embodiment.

FIG. 5 is a simple block diagram illustrating components of an exemplary system 500 according to an embodiment. As shown in FIG. 5, system 500 may include a client 510 having a user interface 511. The client 510 may be connected to a server 540 via a network 530. The post-processor 541, which in this embodiment is located at server 540, may have access to storage device 520 storing hardware models, instruction sets, software packages, a hardware state database, a memory database, and other objects utilized by the simulation system. The server 540 may include a processor that performs a method in accordance with the disclosed embodiments. Such a server then would be part of the overall simulation system in accordance with the disclosed embodiments.

A user may access a post-processor 541 at the server 540 via the client 510 having a user interface 511 capable of accessing and displaying the information captured during simulation. The client 510 may be any computing system that facilitates the user accessing storage device 520, for example a personal computer. The network 530 may be a wired or wireless network that may include a local area network (LAN), a wireless area network (WAN), the Internet, or any other network available for accessing storage device 520 from the client 510.

The server 540 may be a network server accessible to the client 510 via the network 530 that may manage access to storage device 520. The user interface 511 may receive instructions regarding analyzing a simulation from the user and utilizing the objects stored in memory storage 520, facilitate a display of the simulation results queried from the described databases. Multiple different clients (not shown) may access storage device 520 via the network 530 and request access to the objects stored therein.

In another networked environment, the post-processor may be executed on a network capable client and access the other objects stored in one or more storage devices via a network and communications server.

Figure 6:
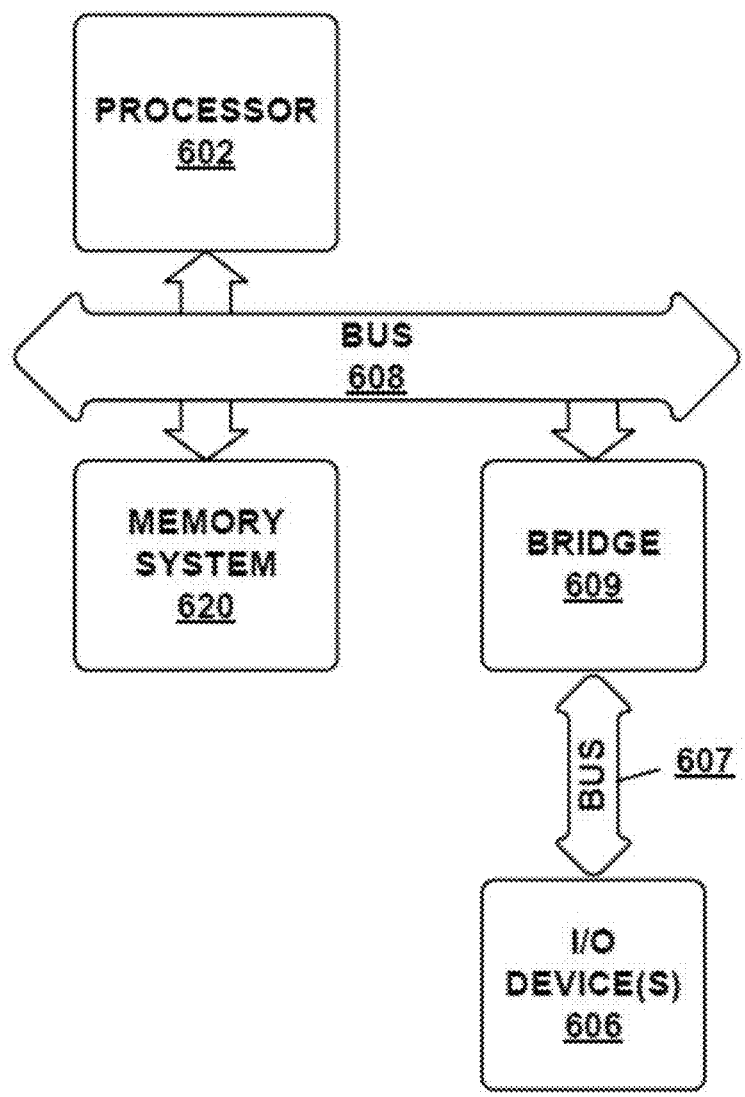
FIG. 6 is a simple block diagram illustrating components of an exemplary client according to an embodiment of the present disclosure.

FIG. 6 is a simple block diagram illustrating components of an exemplary client 610 according to an embodiment of the present invention. As shown in FIG. 6, the client 610 configured to execute the post-processor as described herein may include a processor 602, a memory system 620 and one or more input/output (I/O) devices 606 in communication. The communication can be implemented in a variety of ways and may include one or more computer buses 607, 608 and/or bridge devices 609 as shown in FIG. 6. The I/O devices 606 can include network adapters and/or mass storage devices from which the client 610 can receive commands for executing the simulation.

Referring now to FIGS. 7-13, a number of diagrams consistent with embodiments of the present disclosure are provided. Embodiments included herein provide an apparatus for faster debugging in concurrent fault simulation. Existing approaches often include dumping the debug database for both the good and the faulty machine. Then the two databases may be compared for mismatches. In large SoC designs this approach may lead to a very large debug databases, which makes such an approach very cumbersome for the safety engineers.

In order to achieve safety verification safety engineers often need to be able to take their functional verification environments and inject faults into an SoC. One of the most time consuming jobs of this effort is the validation that the injected fault is propagated and detected at the functional and the checker outputs. Functional outputs are places where an observation of the fault means that the safety goal is violated. Checker outputs are defined as the outputs of the safety mechanism where fault is expected to be detected to meet the safety goal. To validate the fault propagation to the strobe points the safety engineer needs to take number of steps in order to debug a fault and/or its propagation path.

Figure 7:
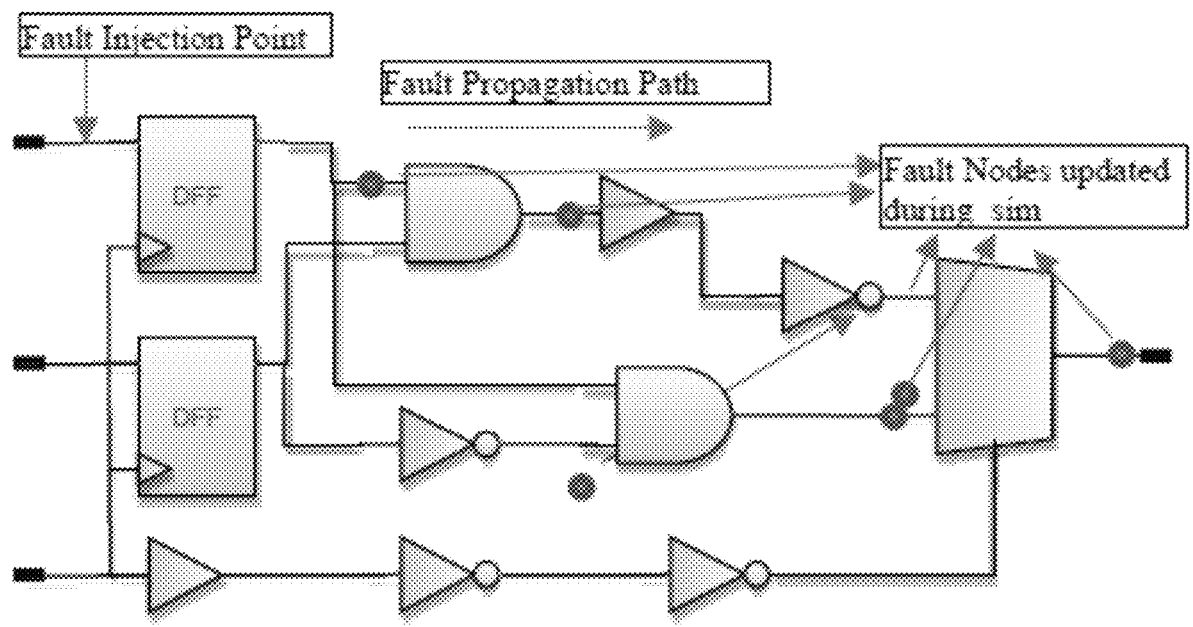
FIG. 7 is a diagram showing a fault propagation path according to an embodiment.

FIG. 7 shows a diagram 700 depicting an example of fault propagation. This example shows a fault injection point and the propagation path through which the fault travels. One or more fault nodes may be updated during the simulation.

Figure 8:
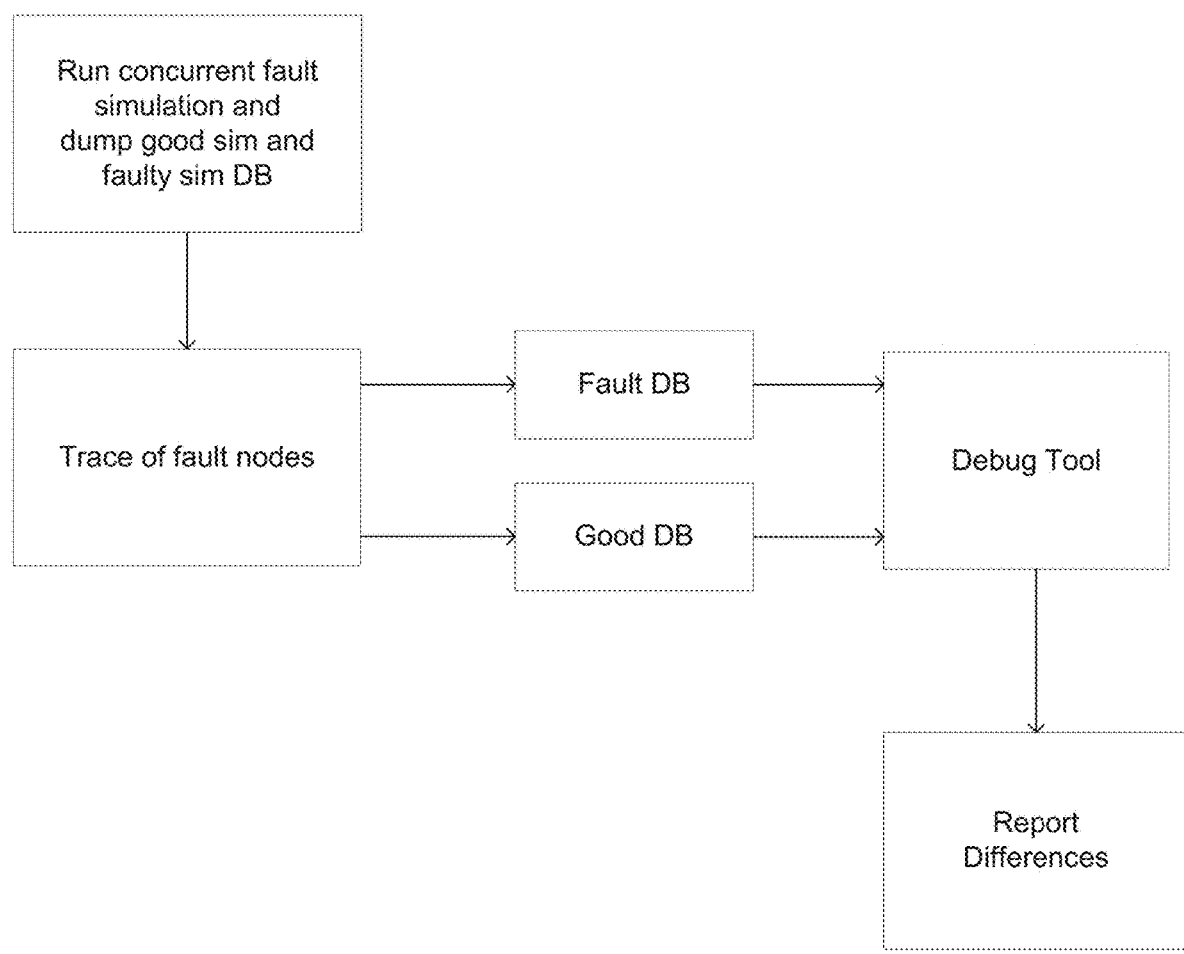
FIG. 8 is a flowchart illustrating operations according to an embodiment.

FIG. 8 shows an example flowchart depicting operations of a proposed debug solution consistent with embodiments of the present disclosure. In some embodiments, the safety engineer may run a concurrent fault simulation, which may include determining the fault node to be analyzed. The system may then dump the debug database, which provides information on good values, faulty values and the trace of only the nodes (e.g., signals of interest) which are in the fault propagation path and/or those that have changed during fault simulation. The user may then use the debug tool to easily inspect this database to narrow down any simulation mismatches.

Accordingly, embodiments of the present disclosure may provide a way to trace back fault propagation in a concurrent fault engine. This may allow the safety engineer to determine the root cause of the exact reason for the fault not getting propagated. Safety engineers may also validate if the fault is propagated through one or more expected design blocks. Embodiments included herein may be configured to only dump the propagation path for the fault which may reduce the debug database size for faster debugging so that safety goals may be achieved in a more expeditious manner.

Figure 9:
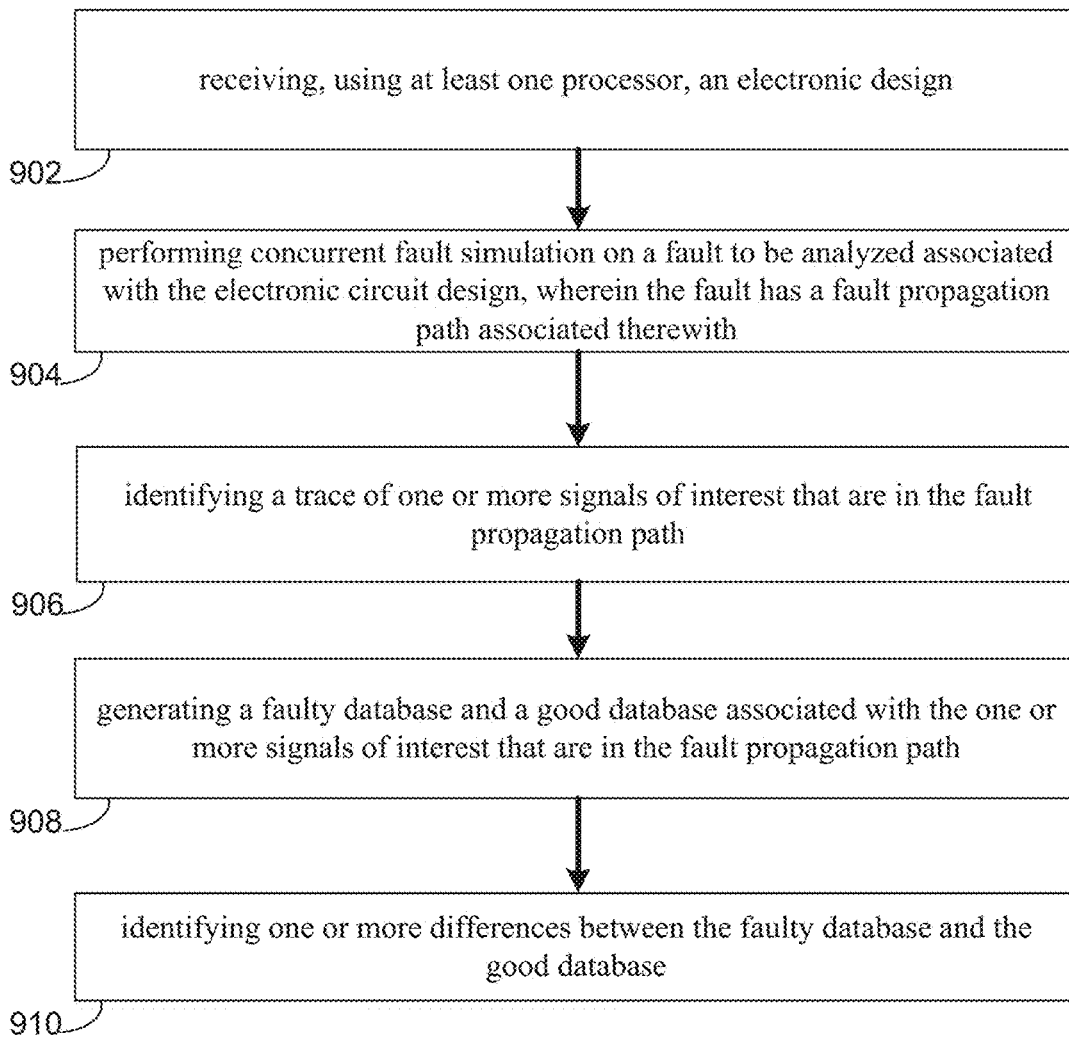
FIG. 9 is a flowchart illustrating operations according to an embodiment of the present disclosure.

Referring now to FIG. 9, a flowchart depicting operations for debugging in a fault simulation are provided. Operations may include receiving (902), using at least one processor, an electronic design and performing (904) concurrent fault simulation on a fault to be analyzed associated with the electronic circuit design, wherein the fault has a fault propagation path associated therewith. Operations may include identifying (906) a trace of one or more signals of interest that are in the fault propagation path and generating (908) a faulty database and a good database associated with the one or more signals of interest that are in the fault propagation path. Operations may further include identifying (910) one or more differences between the faulty database and the good database. Numerous other operations are also within the scope of the present disclosure.

Figure 10:
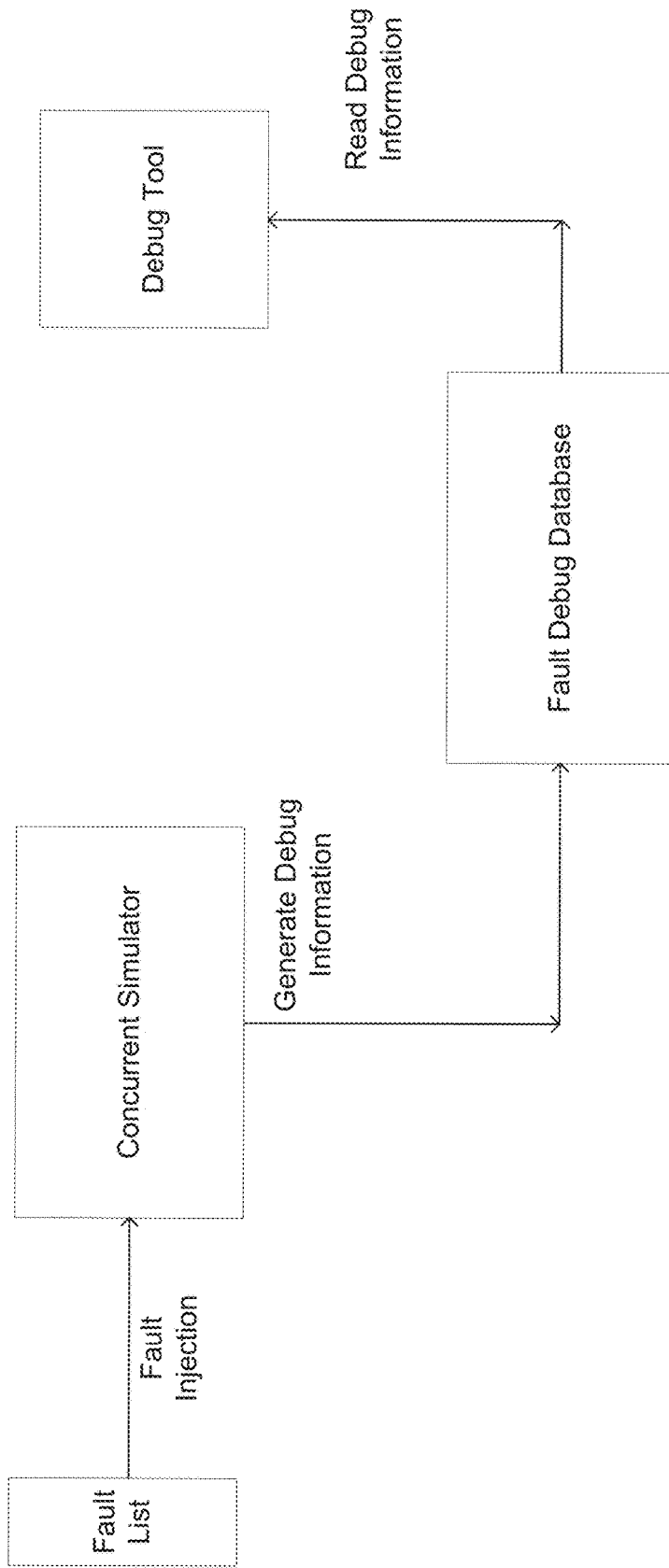
FIG. 10 is a block diagram of an exemplary system according to an embodiment.
Figure 11:
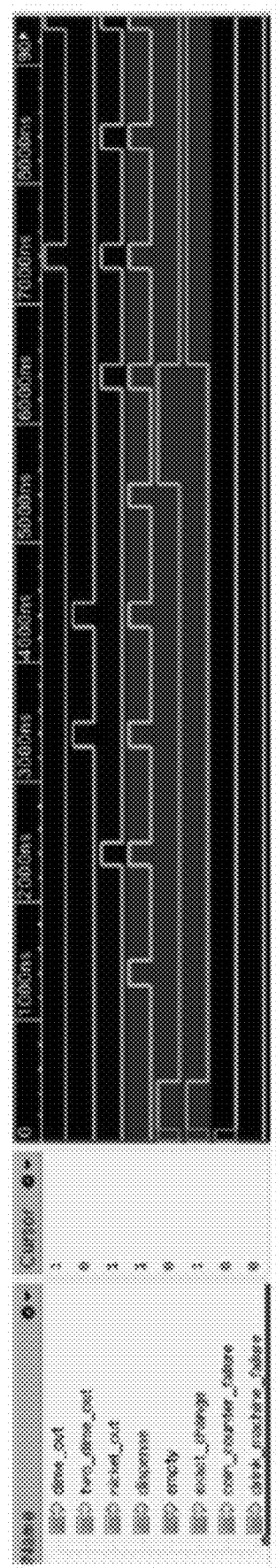
FIG. 11 is a graphical user interface according to an embodiment of the present disclosure.
Figure 12:
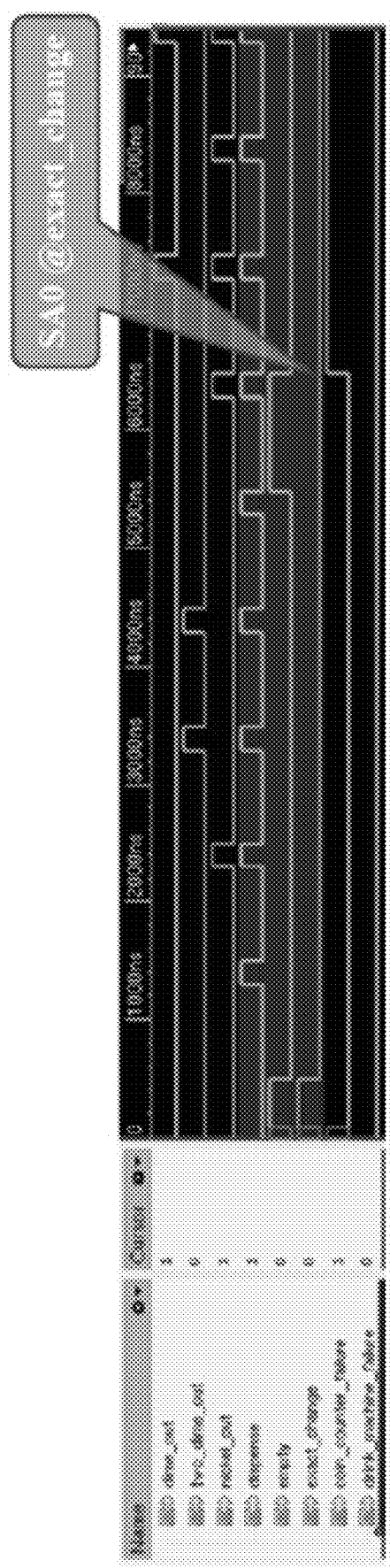
FIG. 12 is a graphical user interface according to an embodiment of the present disclosure.

Referring now to FIGS. 10-12, embodiments showing an example use case consistent with the present disclosure are provided. In this example, users may utilize the fault injection command to inject faults into the concurrent simulation. To debug the fault propagation path the user may need to enable the debug flow by passing an extra option ("-debug") to the TCL command.

In some embodiments, and as shown in FIG. 10, a fault injection command may be used to enable debug (e.g., fault, -inject, -debug, etc.). When this option is passed to the simulation, the concurrent engine may generate the extra information required to be able to debug this fault, which includes additional information, some of which may include, but is not limited to, good value waveform, faulty value waveform, and/or the trace of only the nodes (signals of interest) which are in the fault propagation path and have changed during fault simulation.

In some embodiments, and referring to FIG. 11 an example of a good value waveform showing one or more strobe points is provided. A good value waveform may correspond to the waveform associated with functional simulation and may not consider any fault injection. By default the tool may only generate the good values on the nets on which a fault can be propagated.

In some embodiments, and referring to FIG. 12 an example of a faulty value waveform showing SAO fault @ exact_change is provided. The faulty value waveform may correspond to the waveform associated with only the injected fault the user is trying to debug. This may only generate a waveform of elements which are modified due to the fault injected into the simulation.

In some embodiments, as the fault is propagated to the strobe points, the trace of only the nodes (e.g., signals of interest) which are in the fault propagation path and have changed during fault simulation are recorded by the concurrent simulator into the Fault Debug Database. Accordingly, the user can then easily inspect this database to narrow down any simulation issues.

Figure 13:
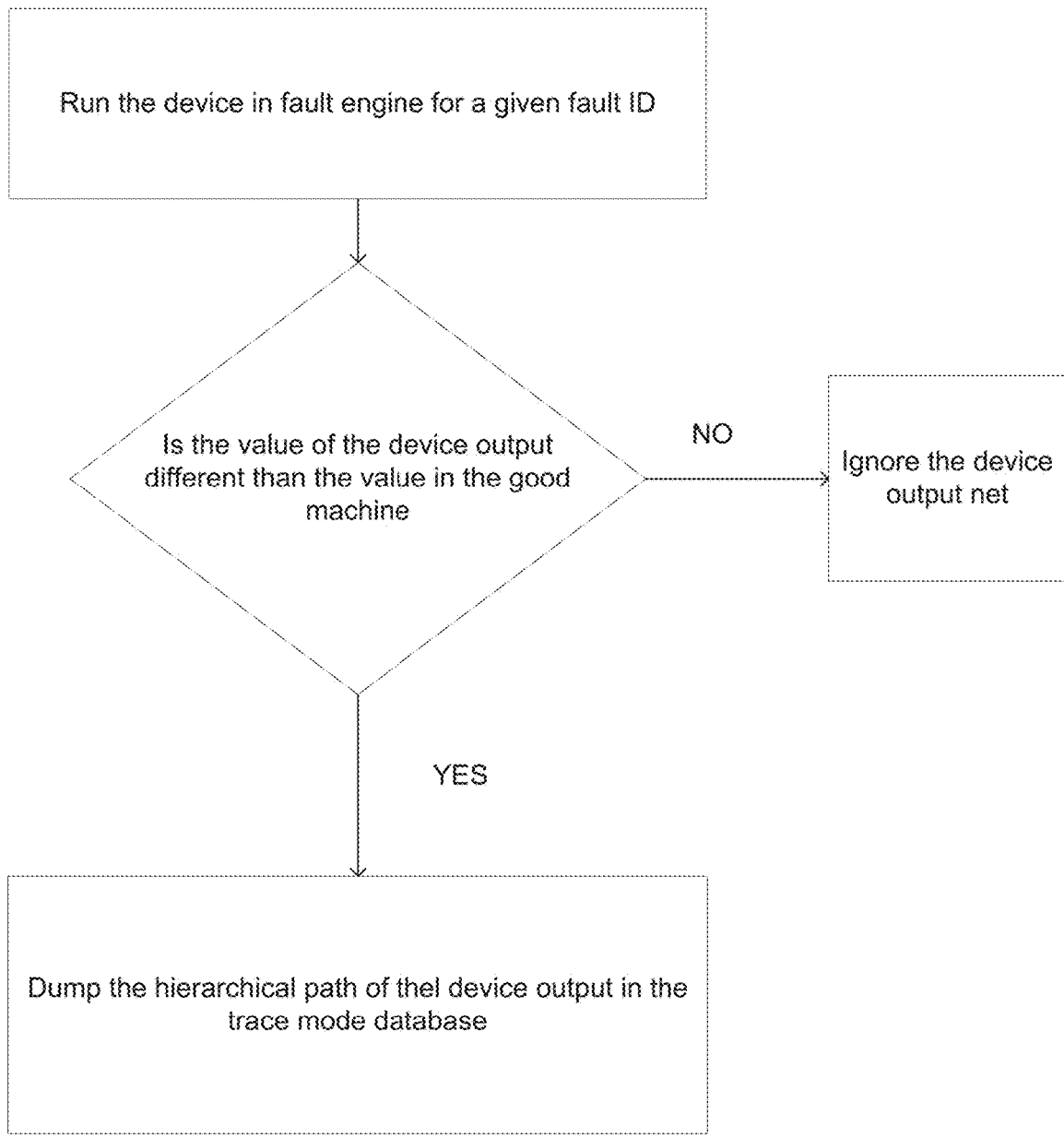
FIG. 13 is a flowchart illustrating operations according to an embodiment of the present disclosure.

Referring now to FIG. 13, an example flowchart depicting operations for identifying the net of interest is provided. In some embodiments, the concurrent engine may only simulate the circuit that is diverging from the good machine. It means that the concurrent engine needs to dump information of a diverged node only. The remaining values may be matching against the good machine so it may not be necessary to dump this information. If the value computed for the device in the fault machine is different from good machine, then the system may be configured to dump this node in the database.

The exemplary methods and computer program instructions may be embodied on a non-transitory computer readable storage medium that may include any medium that can store information. Examples of a computer readable storage medium include electronic circuits, semiconductor memory devices, ROM, flash memory, erasable ROM (EROM), floppy diskette, CD-ROM, optical disk, hard disk, fiber optic medium, or any electromagnetic or optical storage device. In addition, a server or database server may include computer readable media configured to store executable program instructions. The features of the embodiments of the present invention may be implemented in hardware, software, firmware, or a combination thereof and utilized in systems, subsystems, components or subcomponents thereof.

While the invention has been described in detail above with reference to some embodiments, variations within the scope and spirit of the invention will be apparent to those of ordinary skill in the art. Thus, the invention should be considered as limited only by the scope of the appended claims.

What is claimed is:

1. A computer-implemented method for debugging in fault simulation comprising:
    receiving, using at least one processor, an electronic design;
    performing concurrent fault simulation on a fault to be analyzed associated with the electronic circuit design, wherein the fault has a fault propagation path associated therewith;
    identifying a trace of one or more signals of interest that are in the fault propagation path;
    generating a faulty database and a good database associated with the one or more signals of interest that are in the fault propagation path; and
    identifying one or more differences between the faulty database and the good database.

2. The computer-implemented method of claim 1, wherein the one or more signals of interest include one or more signals that have changed during the concurrent fault simulation.

3. The computer-implemented method of claim 1, wherein identifying the trace of one or more signals of interest includes identifying only the trace of the one or more signals of interest that are in the fault propagation path.

4. The computer-implemented method of claim 1, wherein generating the faulty database and the good database associated with the one or more signals of interest includes only generating data that is in the fault propagation path.

5. The computer-implemented method of claim 1, further comprising:
    determining whether the fault propagated through one or more expected design blocks.

6. The computer-implemented method of claim 1, further comprising:
    identifying all similarities between the good database and the faulty database.

7. The computer-implemented method of claim 6, further comprising:
    ignoring the similarities between the good database and the faulty database.

8. A non-transitory computer-readable storage medium having stored thereon instructions that when executed by a machine result in one or more operations for debugging in fault simulation, the operations comprising:
    receiving, using at least one processor, an electronic design;
    performing concurrent fault simulation on a fault to be analyzed associated with the electronic circuit design, wherein the fault has a fault propagation path associated therewith;
    identifying only a trace of one or more signals of interest that are in the fault propagation path;
    ignoring all traces that are not in the fault propagation path;
    generating a faulty database and a good database associated with the one or more signals of interest that are in the fault propagation path; and
    identifying one or more differences between the faulty database and the good database.

9. The computer-readable storage medium of claim 8, wherein the one or more signals of interest include one or more signals that have changed during the concurrent fault simulation.

10. The computer-readable storage medium of claim 8, wherein identifying the trace of one or more signals of interest includes identifying only the trace of the one or more signals of interest that are in the fault propagation path.

11. The computer-readable storage medium of claim 8, wherein generating the faulty database and the good database associated with the one or more signals of interest includes only generating data that is in the fault propagation path.

12. The computer-readable storage medium of claim 8, further comprising:
    determining whether the fault propagated through one or more expected design blocks.

13. The computer-readable storage medium of claim 8, further comprising:
    identifying all similarities between the good database and the faulty database.

14. The computer-readable storage medium of claim 13, further comprising:
    ignoring the similarities between the good database and the faulty database.

15. A system for debugging in fault simulation comprising:
    at least one processor configured to receive an electronic design and perform concurrent fault simulation on a fault to be analyzed associated with the electronic circuit design, wherein the fault has a fault propagation path associated therewith, the least one processor further configured to identify a trace of one or more signals of interest that are in the fault propagation path and that have changed during the fault simulation, the least one processor further configured to ignore all signals that are not in the fault propagation path, the at least one processor further configured to generate a faulty database and a good database associated with the one or more signals of interest that are in the fault propagation path, the least one processor further configured to identify one or more differences between the faulty database and the good database.

16. The system for debugging in fault simulation of claim 15, wherein identifying the trace of one or more signals of interest includes identifying only the trace of the one or more signals of interest that are in the fault propagation path.

17. The system for debugging in fault simulation of claim 15, wherein generating the faulty database and the good database associated with the one or more signals of interest includes only generating data that is in the fault propagation path.

18. The system for debugging in fault simulation of claim 15, further comprising:
   determining whether the fault propagated through one or more expected design blocks.

19. The system for debugging in fault simulation of claim 15, further comprising:
   identifying all similarities between the good database and the faulty database.

20. The system for debugging in fault simulation of claim 19, further comprising:
   ignoring the similarities between the good database and the faulty database.

* * * * *